(12) United States Patent
Takeuchi

(10) Patent No.: US 6,384,476 B2
(45) Date of Patent: *May 7, 2002

(54) SEMICONDUCTOR INTEGRATED CIRCUIT AND PRINTED WIRING SUBSTRATE PROVIDED WITH THE SAME

(75) Inventor: Yasushi Takeuchi, Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/549,192

(22) Filed: Apr. 13, 2000

(30) Foreign Application Priority Data

Apr. 19, 1999 (JP) .......................................... 11-111074

(51) Int. Cl.$^7$ .......................... H01L 23/52; H01L 23/48
(52) U.S. Cl. ........................ 257/691; 257/697; 257/698; 257/786; 257/724; 361/736; 361/748; 361/784
(58) Field of Search ............................. 257/691, 697, 257/698, 786, 724; 438/107, 612, 666; 361/736, 748, 782

(56) References Cited

U.S. PATENT DOCUMENTS

| | | | | |
|---|---|---|---|---|
| 4,153,988 A | * | 5/1979 | Doo | ............................. 29/626 |
| 5,798,571 A | * | 8/1998 | Nakajima | .................... 257/784 |
| 5,847,451 A | | 12/1998 | Ohtaki et al. | ................ 257/697 |
| 6,057,596 A | * | 5/2000 | Lin et al. | ..................... 257/697 |
| 6,207,476 B1 | * | 3/2001 | Zhao et al. | ................. 438/112 |
| 6,225,702 B1 | * | 5/2001 | Nakamura | ................... 257/786 |

FOREIGN PATENT DOCUMENTS

JP          5--82735     *   5/1993

* cited by examiner

Primary Examiner—Jhihan B Clark
(74) Attorney, Agent, or Firm—Fitzpatrick, Cella, Harper & Scinto

(57) ABSTRACT

When a semiconductor integrated circuit having a plurality of electrode pads disposed in an array-like form on the bottom surface thereof is mounted on a printed wiring substrate, a plurality of ground electrode pads and a plurality of power supply electrode pads are concentratedly arranged on the central portion of the semiconductor integrated circuit mounted on the printed wiring substrate so as to constitute groups so as to be opposed to each other, and a decoupling capacitor is mounted on the opposite surface of the printed wiring substrate through a through-hole, whereby the creation of radiation noise is suppressed and the higher density of the printed wiring substrate is achieved.

15 Claims, 6 Drawing Sheets

US 6,384,476 B2

SEMICONDUCTOR INTEGRATED CIRCUIT AND PRINTED WIRING SUBSTRATE PROVIDED WITH THE SAME

BACKGROUND OF THE INVENTION

1. Field of the Invention

This invention relates to a semiconductor integrated circuit having a plurality of electrode pads disposed in an array-like form on the bottom surface thereof, and a printed wiring substrate having the semiconductor integrated circuit mounted thereon.

2. Related Background Art

In recent years, the circuit scale of a semiconductor intergrated circuit has grown larger and larger. As the circuit scale of the semiconductor integrated circuit has grown larger, the number of pins necessary for the connection of the integrated circuit and an external circuit has been increased and therefore, an IC package having a plurality of electrode pads disposed in an array-like form on the bottom surface thereof has been developed. Since it is a semiconductor integrated circuit, the electrode pads disposed in an array-like form on the bottom surface thereof include a power supply electrode pad for supplying a power source to this semiconductor integrated circuit, and a pad for a ground for connecting this semiconductor integrated circuit to the ground potential (ground) on the external circuit side. Heretofore, in the semiconductor integrated circuit having a plurality of electrode pads provided in an array-like form on the bottom surface thereof, the disposition of the power supply electrode pad and the electrode pad for a ground has been determined with the ease of the circuit design of the semiconductor integrated circuit, the allowable current value of an output buffer for an output signal, etc. taken into account, and the positional relationship between the power supply electrode pad and the electrode pad for a ground has not particularly been taken into consideration.

When the above-described prior-art semiconductor integrated circuit having the array-like electrode pads is mounted on a printed wiring substrate, the position of a decoupling capacitor disposed on the printed wiring substrate becomes far from the power supply electrode pad and the electrode pad for the ground of the semiconductor integrated circuit or interferes with the latter by the geometrical disposition with other wiring pattern, depending on the wiring pattern of the printed wiring substrate side, because the positions of the power supply electrode pad and the electrode pad for the ground of the semiconductor integrated circuit are predetermined by only the convenience of the semiconductor integrated circuit side and therefore, it becomes difficult to dispose decoupling capacitors relative to individual power supply electrode pads and electrode pads for the ground.

Therefore, when as represented by recent CPU's and microprocessors, the higher speed of the operating frequency of the semiconductor integrated circuit is remarkably progressing, there arises the problem that the radiation noise of electromagnetic waves from the printed wiring substrates having mounted thereon the semiconductor integrated circuit having the array-like electrode pads or an electronic apparatus carrying them thereon is increased and the standard for the unnecessary radiation noise regulated in various countries cannot be met.

SUMMARY OF THE INVENTION

It is an object of the present invention to solve the above-noted problem and to provide a semiconductor intergrated circuit having the arrangement of array-like electrode pads which can effectively dispose a decoupling capacitor when a semiconductor integrated circuit having a plurality of electrode pads disposed in an array-like form on the bottom surface thereof is mounted on a printed wiring substrate.

It is another object of the present invention to provide a semiconductor integrated circuit of a construction in which a plurality of ground electrode pads and a plurality of power supply electrode pads are constructed as groups and they are disposed in the central portion with the groups opposed to each other to thereby suppress the creation of radiation noise.

Other objects of the present invention will become apparent from the following detailed description of some specific embodiments of the present invention.

DESCRIPTION OF THE PREFERRED EMBODIMENTS (First Embodiment)

Figure 1:
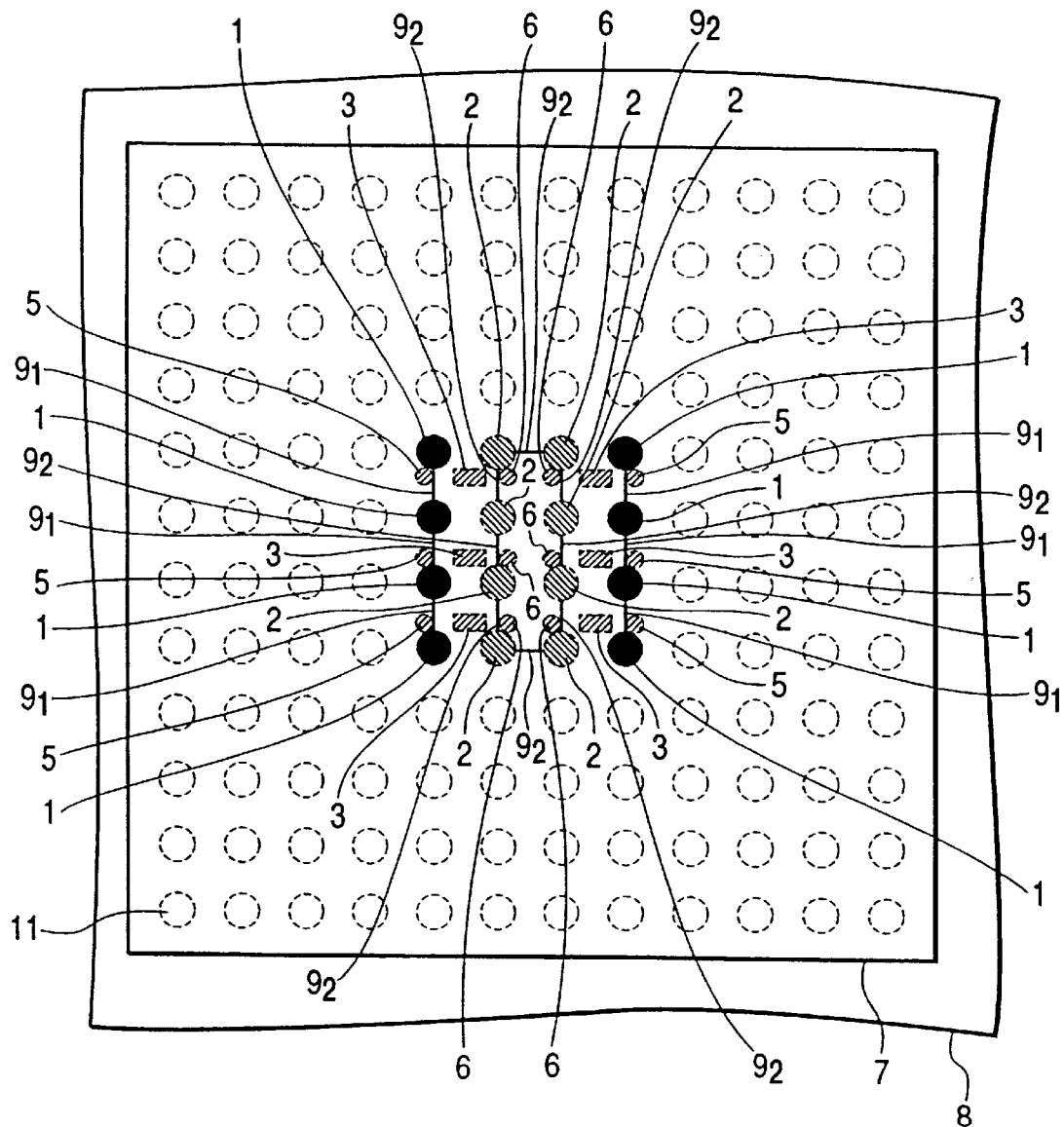
FIG. 1 is a plan view of a printed wiring substrate carrying thereon a semiconductor integrated circuit according to a first embodiment of the present invention.
Figure 2:
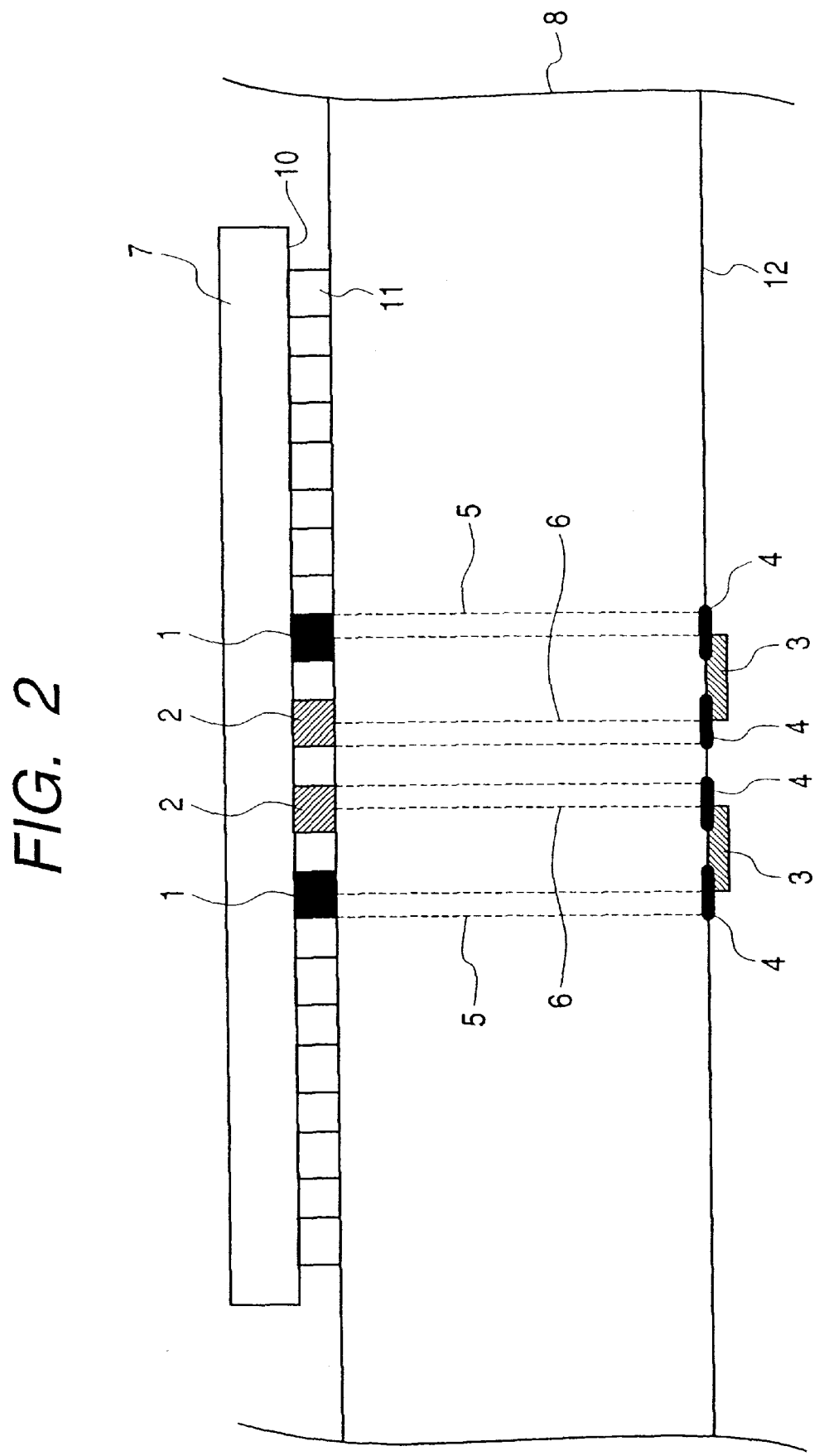
FIG. 2 is a longitudinal cross-sectional view of the printed wiring substrate shown in FIG. 1.

FIG. 1 is a plan view of a printed wiring substrate carrying thereon a semiconductor integrated circuit according to a first embodiment of the present invention, and FIG. 2 is a longitudinal cross-sectional view of the printed wiring substrate of FIG. 1. FIG. 1 shows the printed wiring substrate 8 carrying thereon the semiconductor integrated circuit 7 having array-like electrode pads as it is seen from a surface on which the semiconductor integrated circuit 7 is mounted.

In the bottom surface 10 of the package of the semiconductor integrated circuit 7, a plurality of connecting electrode pads 11 (in FIG. 1, indicated by dotted circles) for making the electrical connection between the semiconductor integrated circuit 7 and an external circuit are regularly arranged at a full grid in a grid-like fashion. Of the connecting electrode pads 11, electrode pads 1 for ground (indicated by black painted-out circles) are connecting electrode pads for grounding the semiconductor integrated circuit 7, and power supply electrode pads 2 (indicated by hatching) are connecting electrode pads for supplying electric power to the semiconductor integrated circuit 7. The electrode pads 1 for ground and the power supply electrode pads 2 are concentratedly disposed on the central portion of the array-like electrode pads, and are arranged so as to be opposed to each other. Also, the electrode pads 1 for ground are grouped into two sets and are connected together by wiring patterns $9_1$, and the power supply electrode pads 2 are all connected together by wiring patterns $9_2$.

On the other hand, decoupling capacitors 3 which are chip type capacitors are mounted on that surface 12 of the printed wiring substrate 8 on which the semiconductor integrated circuit 7 is not mounted. Also, the decoupling capacitors 3 are disposed on the printed wiring substrate 8 so as to lie substantially just beneath the respective electrode pads 1 and 2 when they are seen while being projected from the electrode pads 1 for ground and the power supply electrode pads 2. A pair of carrying pads 4 provided on the printed wiring substrate 8 to solder the decoupling capacitors 3 are formed up to the outside of the electrodes of the decoupling capacitors 3 so that soldering fillets may be sufficiently formed on the opposite sides of the decoupling capacitors 3. Adjacent to the carrying pads 4 on the opposite sides of the decoupling capacitors 3, ground connecting through-holes 5 and power source connecting through-holes 6 for connecting the pair of carrying pads 4 to the electrode pads 1 for ground and the power supply electrode pads 2 of the semiconductor integrated circuit 7 are formed through the printed wiring substrate 8.

The electrode pads 1 for ground and the power supply electrode pads 2 of the semiconductor integrated circuit 7 are concentrated in the central portion of the semiconductor integrated circuit 7. Accordingly, the decoupling capacitors 3 and the carrying pads 4 for soldering can be disposed substantially just beneath the semiconductor integrated circuit 7 and therefore, if the ground connecting through-holes 5 and the power source connecting through-holes 6 are disposed in proximity to the pads 4 for soldering, the electrode pads 1 for ground and the power supply electrode pads 2 of the semiconductor integrated circuit 7 to the decoupling capacitors 3 can be connected together substantially straightly in a vertical direction with a distance corresponding to the thickness of the printed wiring substrate 8.

By adopting such a construction, as shown in FIG. 2, the electrode pads 1 for ground and the power supply electrode pads 2 of the semiconductor integrated circuit 7 to the decoupling capacitors 3 disposed on the printed wiring substrate 8 can be electrically connected together at the shortest distance through the ground connecting through-holes 5 and the power source connecting through-holes 6. Accordingly, the inductance of the wiring pattern from the decoupling capacitors 3 to the electrode pads 1 for ground and the power supply electrode pads 2 of the semiconductor integrated circuit 7 can be made small and the radiation noise of electromagnetic waves from the printed wiring substrate 8 is reduced.

Also, at the same time, the electrode pads 1 for ground and the power supply electrode pads 2 are concentrated in the central portion of the semiconductor integrated circuit and therefore, the drawing-out of the wiring from the other electrode pads for signals to the surrounding parts becomes easy and this is also effective for the higher density of the printed wiring substrate.

(Second Embodiment)

Figure 3:
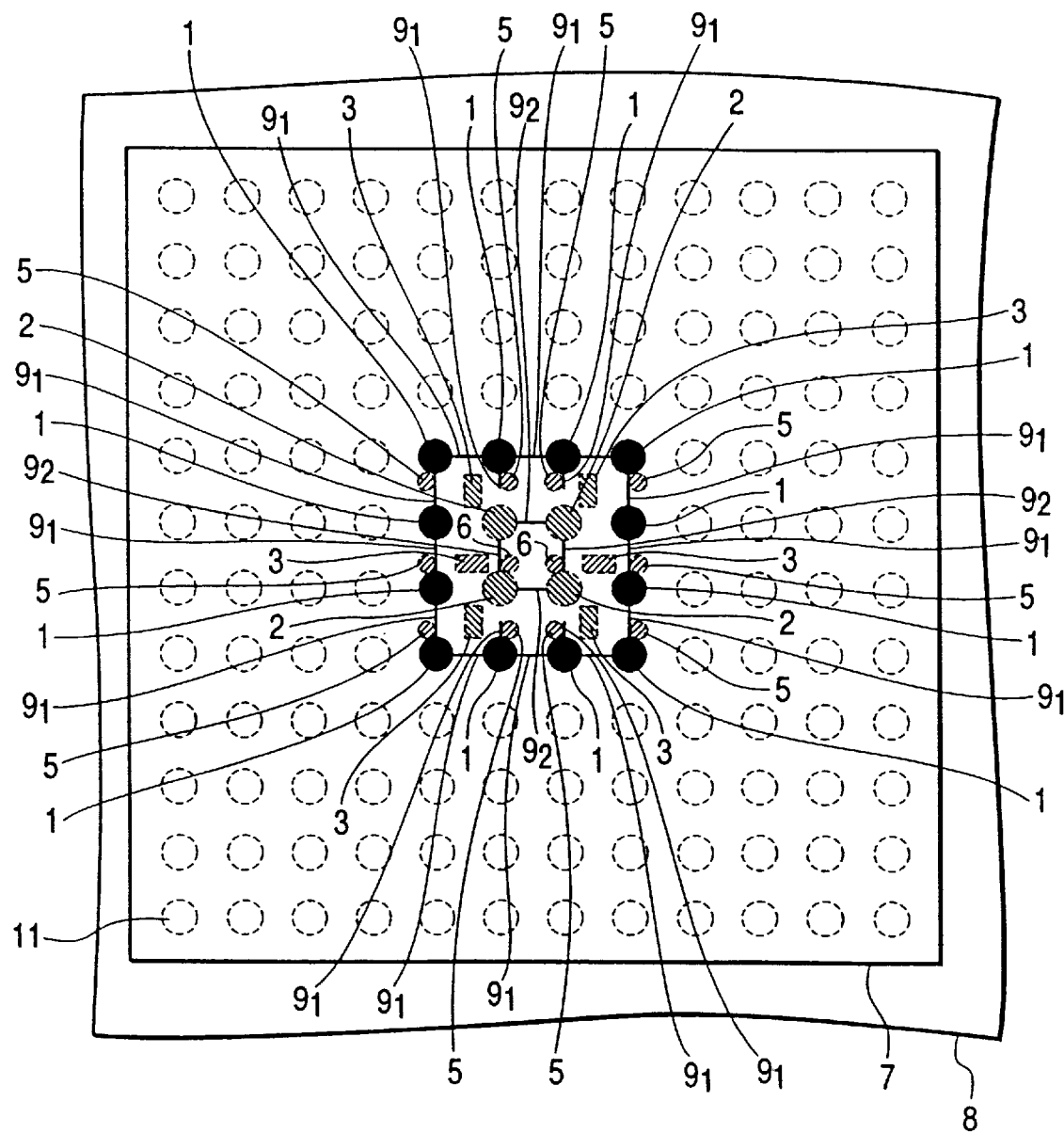
FIG. 3 is a plan view of a printed wiring substrate carrying thereon a semiconductor integrated circuit according to a second embodiment of the present invention.

FIG. 3 is a plan view of a printed wiring substrate carrying thereon a semiconductor integrated circuit according to a second embodiment of the present invention. In this embodiment, as shown in FIG. 3, the power supply electrode pads 2 of the semiconductor integrated circuit 7 of FIGS. 1 and 2 are disposed on the innermost side and the electrode pads 1 for ground are disposed so as to surround the power supply electrode pads 2, and all of the power supply electrode pads 2 and all of the electrode pads 1 for ground are connected by a wiring pattern $9_2$ and a wiring pattern $9_1$, respectively. In the other points, the construction of the present embodiment is the same as that of the first embodiment.

Again in such a construction, as in the first embodiment, the radiation noise of electromagnetic waves from the printed wiring substrate 8 is reduced and the drawing-out of the wiring from the electrode pads for signals to the surrounding parts becomes easy, and this is also effective for the higher density of the printed wiring substrate.

(Third Embodiment)

Figure 4:
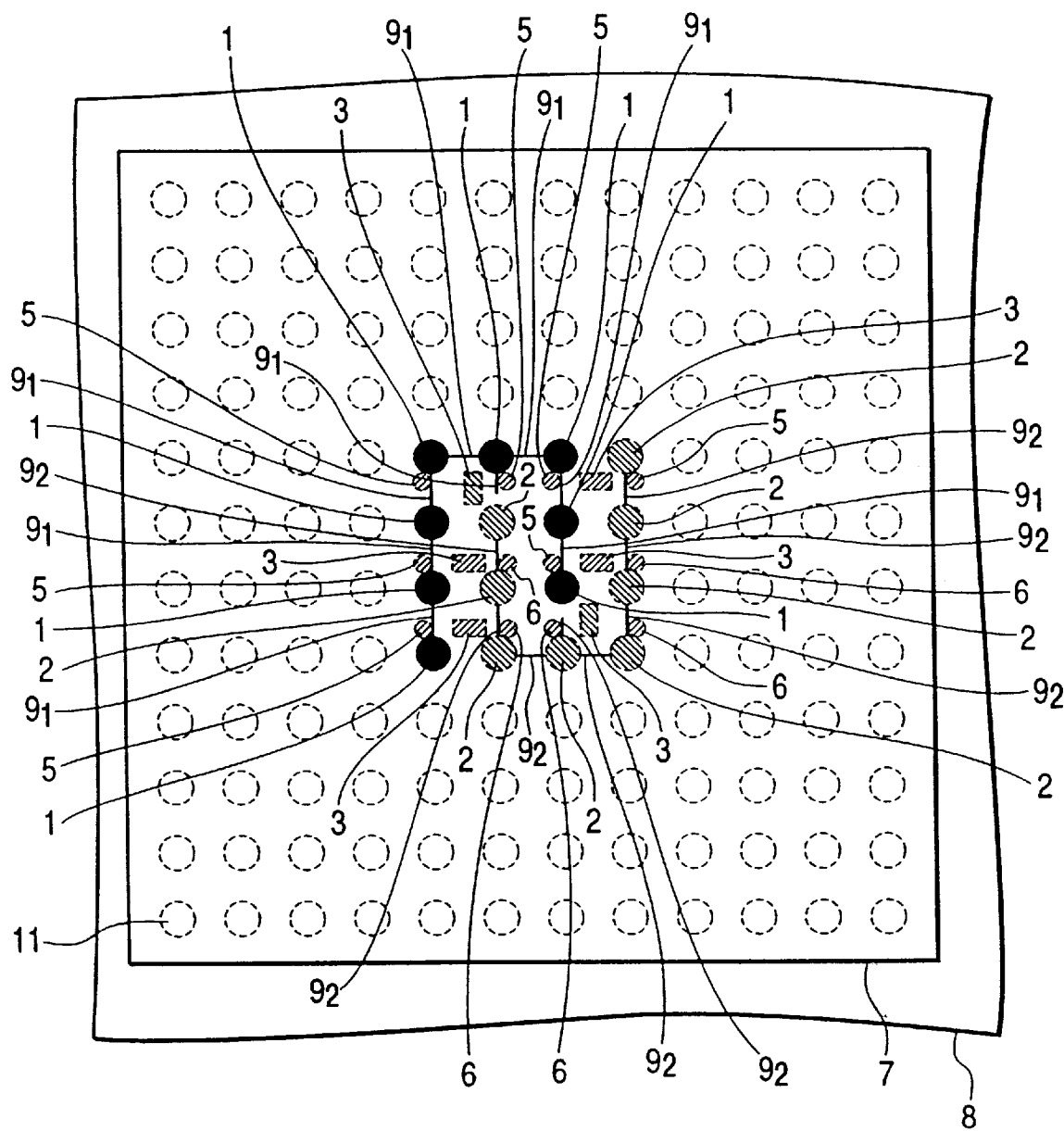
FIG. 4 is a plan view of a printed wiring substrate carrying thereon a semiconductor integrated circuit according to a third embodiment of the present invention.

FIG. 4 is a plan view of a printed wiring substrate carrying thereon a semiconductor integrated circuit according to a third embodiment of the present invention. This embodiment is such that in the first embodiment, the electrode pads 1 for ground and the power supply electrode pads 2 are disposed in spirally opposed relationship with each other and in the other points, the construction of the present embodiment is the same as that of the first embodiment.

Again in such a construction, as in the first embodiment, the radiation noise of electromagnetic waves from the printed wiring substrate 8 is reduced and the drawing-out of the wiring from the electrode pads for signals to the surrounding parts becomes easy, and this is also effective for the higher density of the printed wiring substrate.

(Fourth Embodiment)

Figure 5:
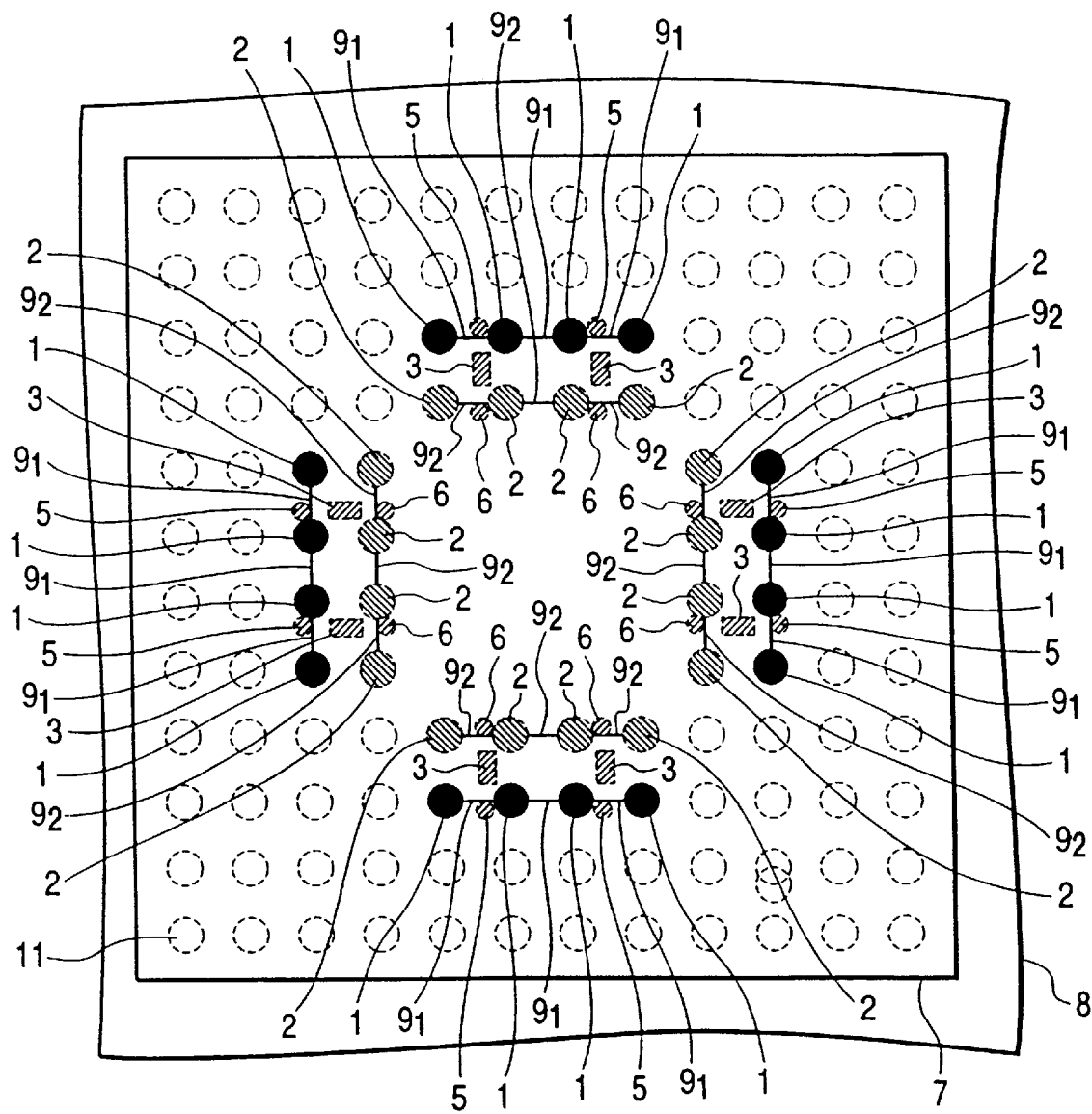
FIG. 5 is a plan view of a printed wiring substrate carrying thereon a semiconductor integrated circuit according to a fourth embodiment of the present invention.

FIG. 5 is a plan view of a printed wiring substrate carrying thereon a semiconductor integrated circuit according to a fourth embodiment of the present invention. In this embodiment, the array-like electrode pads of the semiconductor integrated circuit 7 are disposed in a peripheral state, and as in the first present, the electrode pads 1 for ground and the power supply electrode pads 2 are opposed to each other in pairs, and the electrode pads 1 for ground and the power supply electrode pads 2 are each grouped into four sets and are connected by wiring patterns $9_1$, and wiring patterns $9_2$, respectively. In the other points, the construction of the present embodiment is the same as that of the first embodiment.

Again in such a construction, as in the first embodiment, the radiation noise of electromagnetic waves from the printed wiring substrate 8 is reduced and this is also effective for the higher density of the printed wiring substrate.

Figure 6:
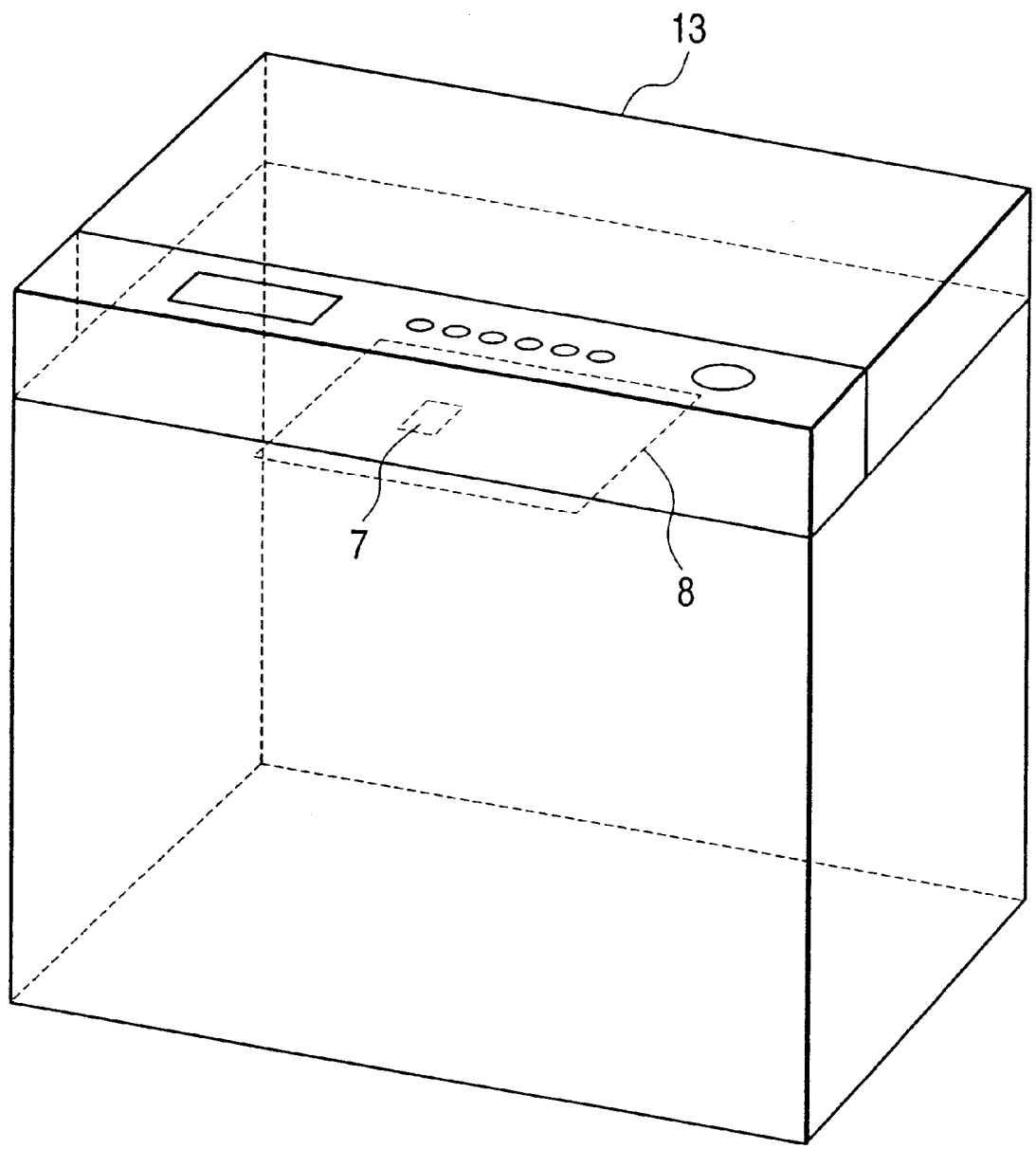
FIG. 6 is a perspective view of an electronic apparatus provided with a printed wiring substrate having mounted thereon the semiconductor integrated circuit according to any one of the first to fourth embodiments of the present invention.

FIG. 6 illustrates an electronic apparatus having mounted thereon the semiconductor integrated circuit shown as one of the first to fourth embodiments of the present invention.

The electronic apparatus 13 of FIG. 6 incorporates therein the printed wiring substrate 8 having the semiconductor integrated circuit 7 of any one of FIGS. 1 to 5 mounted thereon.

In the electronic apparatus of this embodiment, the radiation noise of electromagnetic waves from the semiconductor integrated circuit 7 is little and therefore, the radiation noise of electromagnetic waves from the electronic apparatus 13 is more reduced than the radiation noise of electromagnetic waves from a conventional electronic apparatus and the printed wiring substrate 8 is suited for higher density and therefore, higher performance is possible by small measure.

While the embodiments of the present invention have been described above, the total number of the connecting electrode pads of the semiconductor integrated circuit and the number of the decoupling capacitors are not limited to those shown in the figures, and the positions of the electrode pads for ground and the power supply electrode pads may change places with each other, and can be changed in conformity with the design. Also, the printed wiring substrate having the semiconductor integrated circuit mounted thereon is not restricted to a two-layer plate, but a multi-layer plate can be used.

As described above, according to the present invention, the ground connecting electrode pads and the power source connecting electrode pads are concentratedly disposed on the central portion of the semiconductor integrated circuit having array-like electrode pads, whereby when the semiconductor integrated circuit is mounted on the printed wiring substrate and the decoupling capacitors are disposed on the surface opposite to the surface on which the semiconductor integrated circuit is mounted, the wiring distance among the electrode pads for ground and the power supply electrode pads and the decoupling capacitors becomes shortest and the inductance of the wiring pattern for ground and the power supply wiring pattern becomes small, and the radiation noise of electromagnetic waves from the printed wiring substrate and the electronic apparatus carrying it thereon is reduced and at the same time, the wiring of the semiconductor integrated circuit and parts disposed around it can be effected highly densely and easily, and this contributes to the higher density of the printed wiring substrate, which in turn leads to the effect that the downsizing and higher weight of a high-performance electronic apparatus are realized.

What is claimed is:

1. A semiconductor integrated circuit having a plurality of connecting electrode pads disposed in an array-like form on the bottom surface thereof, including:

a plurality of ground electrode pads of said plurality of connecting electrode pads which are for the connection to the ground potential, said plurality of ground electrode pads being disposed on the central portion;

a first wiring pattern connecting said plurality of ground electrode pads together;

a plurality of power supply electrode pads of said plurality of connecting electrode pads which are for supplying a power source, said plurality of power supply electrode pads being disposed on the central portion; and a second wiring pattern connecting said plurality of power supply electrode pads together.

2. A semiconductor integrated circuit according to claim 1, wherein said first wiring pattern connects said plurality of ground electrode pads together into at least one group and said second wiring pattern connects said plurality of power supply electrode pads together into at least one group.

3. A semiconductor integrated circuit according to claim 1, wherein said plurality of ground electrode pads and said plurality of power supply electrode pads are formed into a predetermined shape by said first wiring pattern and said second wiring pattern.

4. A semiconductor integrated circuit according to claim 1, wherein said first wiring pattern connects said plurality of ground electrode pads together into two groups, said second wiring pattern connects said plurality of power supply electrode pads together into two groups, and said plurality of ground electrode pads and said plurality of power supply electrode pads are opposed to each other between the groups.

5. A semiconductor integrated circuit according to claim 1, wherein said plurality of ground electrode pads and said plurality of power supply electrode pads are formed so as to provide a peripheral portion in said first wiring pattern and said second wiring pattern.

6. A semiconductor integrated circuit according to claim 2, wherein said plurality of ground electrode pads are connected together into at least one group are disposed in individually opposed relationship with said plurality of power supply electrode pads connected together into at least one group.

7. A semiconductor integrated circuit having a plurality of connecting electrode pads disposed in an array-like form on the bottom surface thereof, including:

a plurality of ground electrode pads of said plurality of connecting electrode pads which are for the connection to the ground potential, said plurality of ground electrode pads being disposed on the central portion;

a first wiring pattern connecting said plurality of ground electrode pads together, said first wiring pattern connecting said plurality of ground electrode pads together into at least one group;

a plurality of power supply electrode pads of said plurality of connecting electrode pads which are for supplying a power source, said plurality of power supply electrode pads being disposed on the central portion; and a second wiring pattern connecting said plurality of power supply electrode pads together, said second wiring pattern connecting said plurality of power supply electrode pads together into at least one group, said plurality of power supply electrode pads being opposed to said plurality of ground electrode pads between the groups.

8. A printed wiring substrate having a semiconductor integrated circuit mounted thereon, including;

a semiconductor integrated circuit having a plurality of connecting electrode pads disposed in an array-like form on the bottom surface thereof, said semiconductor integrated circuit having:

(a) a plurality of ground electrode pads of said plurality of connecting electrode pads which are connected to the ground potential; and (b) a plurality of power supply electrode pads of said plurality of connecting electrode pads which supply a power source, said plurality of ground electrode pads and said plurality of power supply electrode pads being disposed on the central portion in opposed relationship with each other so as to form groups, a printed wiring substrate carrying said semiconductor integrated circuit thereon, said printed wiring substrate having:

(c) a decoupling capacitor mounted on the surface opposite to the surface carrying said semiconductor integrated circuit thereon; and (d) a through-hole in the printed wiring substrate; said through-hole connecting said decoupling capacitor to any of said plurality of ground electrode pads and said plurality of power supply electrode pads.

9. A printed wiring substrate according to claim 8, further including:

a first wiring pattern connecting said plurality of ground electrode pads together into at least one group, and a second wiring pattern connecting said plurality of power supply electrode pads together into at least one group.

10. A printed wiring substrate according to claim 8, further including:

a first wiring pattern connecting said plurality of ground electrode pads together into two groups, and a second wiring pattern connecting said plurality of power supply electrode pads together into two groups, said plurality of ground electrode pads and said plurality of power supply electrode pads being opposed to each other among the groups.

11. A printed wiring substrate according to claim 9, wherein said plurality of ground electrode pads and said plurality of power supply electrode pads are formed into a predetermined shape by said first wiring pattern and said second wiring pattern.

12. A printed wiring substrate according to claim 9, wherein said plurality of ground electrode pads and said plurality of power supply electrode pads are formed so as to provide a peripheral portion in said first wiring pattern and said second wiring pattern.

13. A semiconductor integrated circuit having a plurality of connecting electrode pads disposed in an array-like form on a bottom surface thereof, comprising:

a plurality of ground electrode pads of said plurality of connecting electrode pads which are for connection to a ground potential, said plurality of ground electrode pads being connected through a first wiring pattern and forming at least one group; and a plurality of power supply electrode pads for supplying a power source for said plurality of connecting electrode pads, each of said plurality of power supply electrode pads being disposed opposite to each of said ground electrode pads, and being connected through a second wiring pattern and forming at least one group.

14. A semiconductor integrated circuit according to Claim 13, wherein said plurality of power supply electrode pads which are disposed opposite and said plurality of power supply electrode pads are both provided in the same number.

15. A printed wiring substrate on which a semiconductor integrated circuit is mounted, comprising:

a semiconductor integrated circuit having a plurality of connecting electrode pads disposed in an array-like form on a bottom surface thereof, having a plurality of ground electrode pads of said plurality of connecting electrode pads which are for connection to a ground potential, said plurality of ground electrode pads being connected through a first wiring pattern and forming at least one group, and a plurality of power supply electrode pads for supplying a power source for said plurality of connecting electrode pads, each of said plurality of power supply electrode pads being disposed opposite to each of said ground electrode pads at a region adjacent to said ground electrode pads, and being connected through a second wiring pattern and forming at least one group;

a printed wiring substrate on which a component can be mounted on a front surface and a back surface thereof, said printed wiring substrate having a plurality of through holes extending through said printed wiring substrate from the front surface; and a decoupling condenser mounted on the surface of said printed wiring surface opposite to the surface on which said semiconductor integrated circuit is mounted, said decoupling condenser is connected to said ground electrode pads and said power supply electrode pads through said through hole provided in said printed wiring substrate.

* * * * *

UNITED STATES PATENT AND TRADEMARK OFFICE
CERTIFICATE OF CORRECTION

PATENT NO. : 6,384,476 B2
DATED : May 7, 2002
INVENTOR(S) : Takeuchi et al.

It is certified that error appears in the above-identified patent and that said Letters Patent is hereby corrected as shown below:

Title page,
Item [*] Notice, delete "0" and insert -- 11 --.

Column 4,
Line 30, "present," should read -- embodiment --.

Column 5,
Line 60, "are" should be deleted..

Column 6,
Line 21, "including;" should read -- including: --.

Column 8,
Line 21, "wiring surface" should read -- wiring substrate --.

Signed and Sealed this

Ninth Day of September, 2003

JAMES E. ROGAN
*Director of the United States Patent and Trademark Office*